United States Patent
Park et al.

(10) Patent No.: US 8,320,188 B2
(45) Date of Patent: Nov. 27, 2012

(54) SEMICONDUCTOR APPARATUS AND METHOD FOR TRANSFERRING CONTROL VOLTAGE

(75) Inventors: Myung Jin Park, Icheon-si (KR); Sang Kyu Lee, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 140 days.

(21) Appl. No.: 12/982,958

(22) Filed: Dec. 31, 2010

(65) Prior Publication Data
US 2012/0026800 A1    Feb. 2, 2012

(30) Foreign Application Priority Data
Jul. 28, 2010    (KR) .................. 10-2010-0072677

(51) Int. Cl.
*G11C 16/06* (2006.01)
(52) U.S. Cl. .......... 365/185.23; 365/189.09; 365/230.06
(58) Field of Classification Search ............. 365/185.23, 365/189.09, 230.06, 185.22
See application file for complete search history.

(56) References Cited

U.S. PATENT DOCUMENTS

| | | | |
|---|---|---|---|
| 6,317,366 B1 | 11/2001 | Okamura et al. | |
| 6,347,052 B1 * | 2/2002 | Akaogi et al. | ........... 365/185.23 |
| 6,765,828 B2 | 7/2004 | Yamashita | |
| 7,675,782 B2 | 3/2010 | Cohen et al. | |
| 2008/0291740 A1 | 11/2008 | Sato et al. | |

FOREIGN PATENT DOCUMENTS

| | | |
|---|---|---|
| JP | 2004-295970 | 10/2004 |
| JP | WO2006090442 A1 | 8/2006 |

* cited by examiner

*Primary Examiner* — David Lam
(74) *Attorney, Agent, or Firm* — William Park & Associates Ltd.

(57) ABSTRACT

A semiconductor apparatus includes a control voltage transfer unit configured to transfer a control voltage transmitted through first transmission lines, to second transmission lines in response to a select signal transmitted through a select signal transmission line; a select signal driving unit configured to drive the select signal to the select signal transmission line; and a voltage boosting control unit configured to float the select signal transmission line when a voltage level of the select signal transmission line increase to or above a target level.

12 Claims, 6 Drawing Sheets

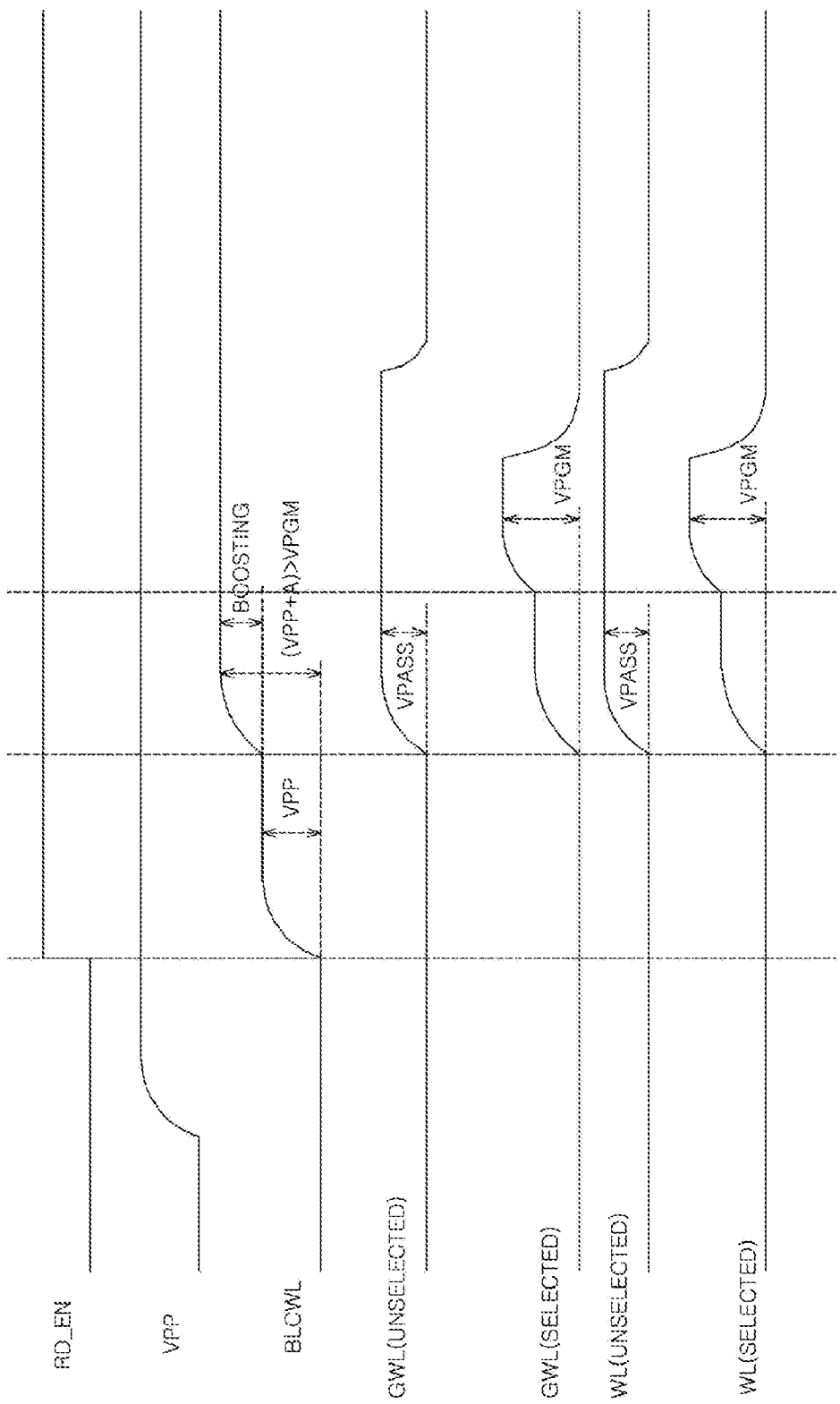

SEMICONDUCTOR APPARATUS AND METHOD FOR TRANSFERRING CONTROL VOLTAGE

CROSS-REFERENCES TO RELATED APPLICATION

The present application claims priority under 35 U.S.C. §119(a) to Korean application number 10-2010-0072677, filed on Jul. 28, 2010 in the Korean Intellectual Property Office, which is incorporated herein by reference in its entirety.

BACKGROUND

1. Technical Field

The present invention relates generally to a semiconductor apparatus and a semiconductor memory apparatus, and more particularly to a technology for efficiently transferring a control voltage.

2. Related Art

In a programming operation state of a flash memory apparatus having a plurality of local word lines, a certain local word line selected among the plurality of local word lines would be driven with a word line programming voltage, but the unselected local word lines are driven with a word line pass voltage which is at a lower voltage level than the word line programming voltage.

The word line programming voltage and the word line pass voltage that were generated by an internal voltage generation circuit are transmitted through global word lines, and these voltages are selectively transferred to the appropriate local word lines through voltage transfer transistors. The voltage transfer transistors are controlled through a select signal having a high voltage level so as to secure voltage transfer efficiency.

The word line programming voltage described above is considered a very high voltage in the flash memory applications. With rising word line programming voltage, the threshold voltage (Vth) of the voltage transfer transistors will also increase due to the body effect and others. However, the threshold voltage of the voltage in transfer transistors when elevated will deteriorate the voltage transfer efficiency. This problem of deteriorated voltage transfer efficiency due to the elevated level of threshold voltage of the voltage transfer transistors can be coped by raising the voltage level of the select signal for controlling the voltage transfer transistors. However, when considering the breakdown voltage of the transistors, there are limitations in raising the voltage level of the select signal in the internal voltage generation circuit.

SUMMARY

Embodiments of the present invention are directed to a semiconductor apparatus and method for transferring control voltage capable of transferring a control voltage efficiently.

In an embodiment of the present invention, a semiconductor apparatus includes, inter alia: a control voltage transfer unit configured to transfer a control voltage transmitted through first transmission lines, to second transmission lines in response to a select signal transmitted through a select signal transmission line; a select signal driving unit configured to drive the select signal to the select signal transmission line; and a voltage boosting control unit configured to float the select signal transmission line when a voltage level of the select signal transmission line increase to or above a target level.

In an embodiment of the present invention, a control voltage transfer method for transferring a control voltage transmitted through first transmission lines to second transmission lines in response to a select signal transmitted through a select signal transmission line includes the steps of: floating the select signal transmission line when a voltage level of the select signal transmission line increases to or above a target level; and boosting the voltage level of the select signal transmission line as a voltage level of the control voltage transmitted through the first transmission lines increases.

BRIEF DESCRIPTION OF THE DRAWINGS

Features, aspects, and embodiments are described in conjunction with the attached drawings, in which:

FIG. 6 is a timing diagram illustrating internal operations of the semiconductor memory apparatus shown in FIGS. 2 through 5.

DETAILED DESCRIPTION

Figure 1:
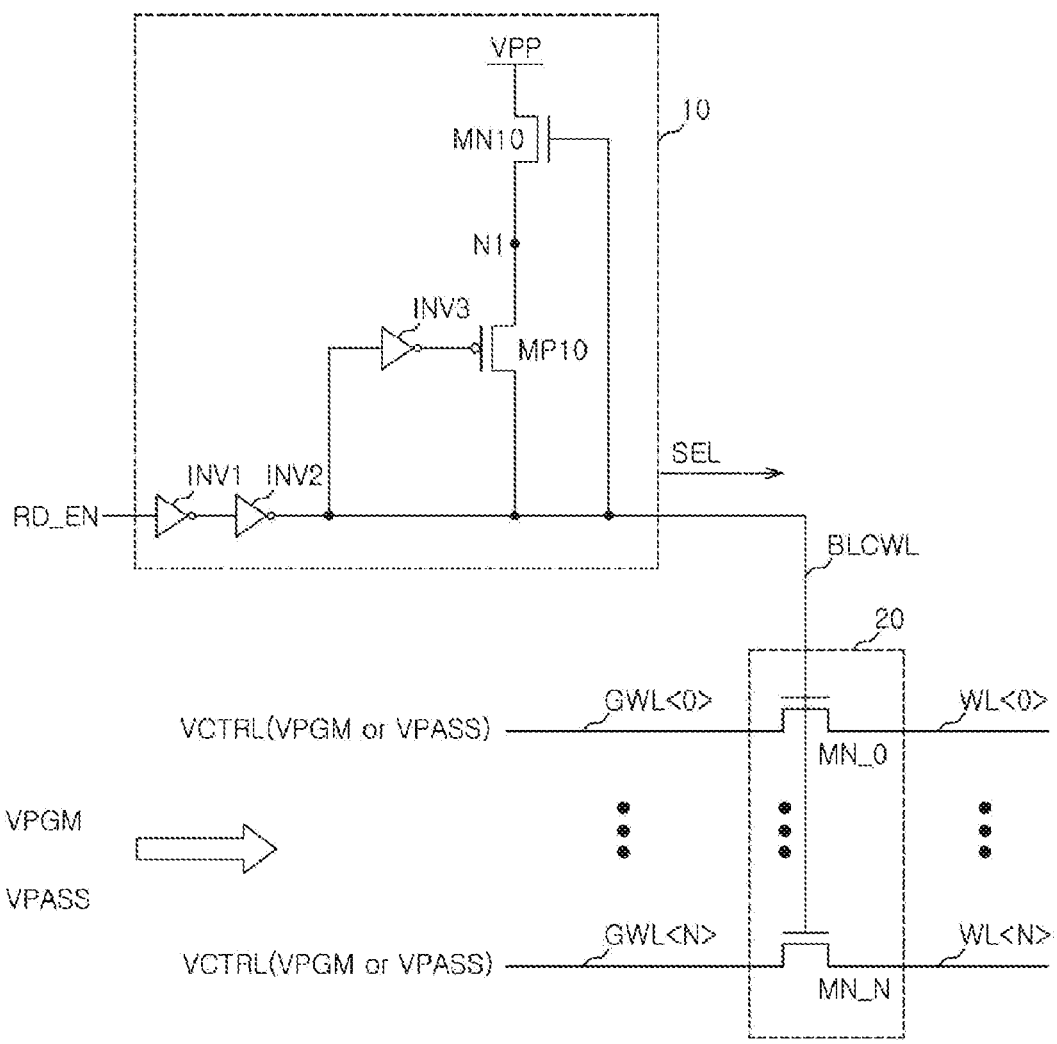
FIG. 1 is a configuration diagram of a semiconductor memory apparatus in accordance with an embodiment of the present invention.

Hereinafter, a semiconductor apparatus and a method for transferring a control voltage according to embodiments of the present invention will be described below with reference to the accompanying drawings through exemplary embodiments.

For reference, since the terms, symbols, and signs that are used in the drawings and in this detailed description to designate devices, blocks, and others may be used for detailed units as the occasion demands, it is to be noted that the same terms, symbols, and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

FIG. 1 is a configuration diagram of a semiconductor memory apparatus 1 in accordance with an embodiment of the present invention.

Shown in FIG. 1 is the semiconductor memory apparatus 1 in accordance with an embodiment of the present invention, which includes a simplified configuration suited to convey the technical description more clearly.

Referring to FIG. 1, a semiconductor memory apparatus 1 in includes a select signal driving unit 10 and a control voltage transfer unit 20.

The select signal driving unit 10 is configured to drive a select signal SEL to a select signal transmission line BLCWL using the voltage of a driving voltage terminal VPP under the control of a driving enable signal RD_EN. Accordingly, as the driving enable signal RD_EN is activated to a high level, the voltage level of the select signal transmission line BLCWL is raised through the voltage of the driving voltage terminal VPP, that is, a boosting voltage VPP.

The control voltage transfer unit 20 is configured to be connected between a plurality global word lines GWL<0> through GWL<N> and a plurality of local word lines(that is, a plurality of transmission line) WL<0> through WL<N>. The control voltage transfer unit 20 is comprised of a plurality of NMOS transistors MN_0 through MN_N which are controlled by the select signal SEL. Although FIG. 1 shows one select signal SEL controlling all NMOS transistors MN_0 through MN_N in accordance with an embodiment of the present invention, a different configuration is also possible, in which a plurality of select signals (as opposed to a single SEL) may be utilized to control the plurality of NMOS transistors MN_0 through MN_N on either one-to-one or one-to-plural basis.

A word line programming voltage VPGM and a word line pass voltage VPASS are transmitted through the plurality of global word lines GWL<0> through GWL<N>. If the select signal SEL of a high voltage is applied to the plurality of NMOS transistors MN_0 through MN_N, the plurality of NMOS transistors MN_0 through MN_N are turned on. When the plurality of NMOS transistors MN_0 through MN_N are turned on, the word line programming voltage VPGM and the word line pass voltage VPASS are transferred to the plurality of local word lines WL<0> through WL<N>.

Figure 2:
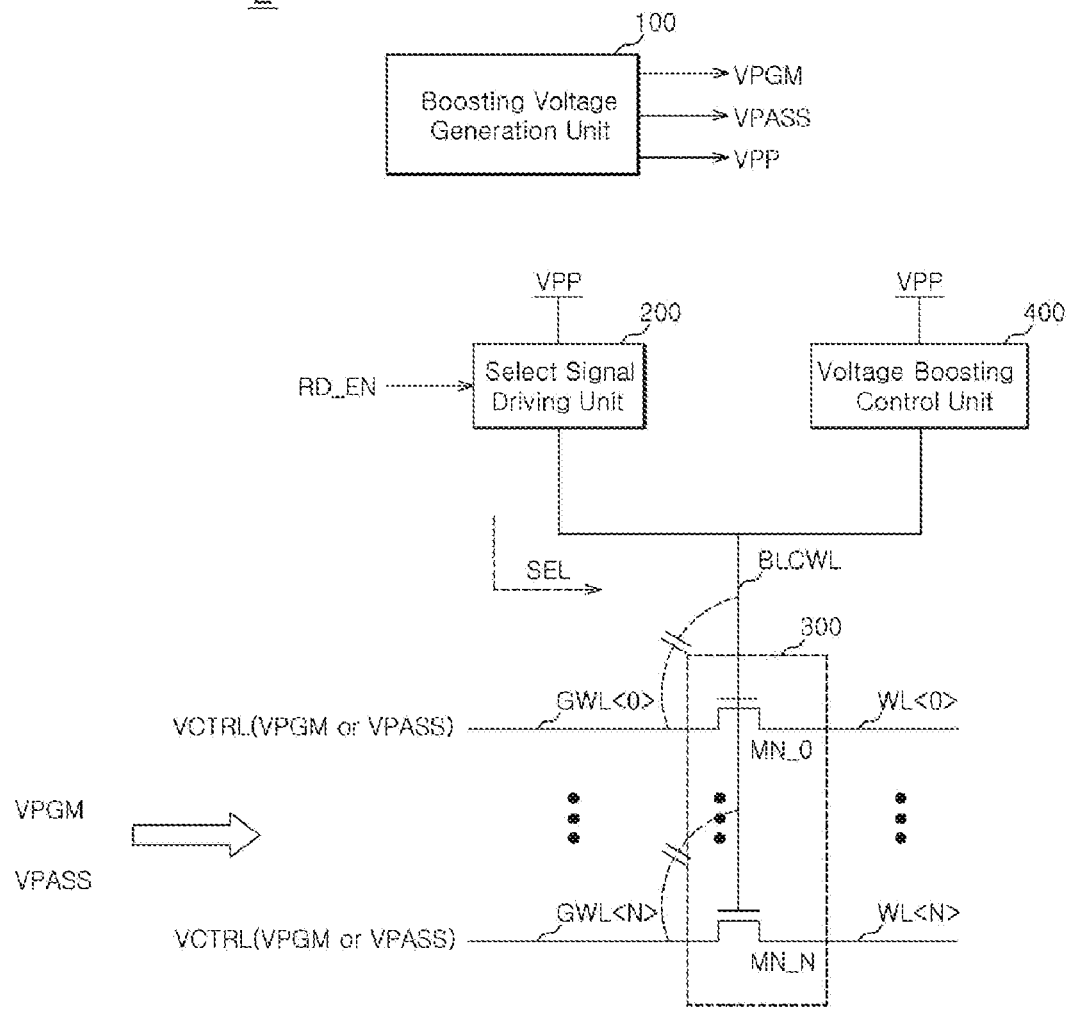
FIG. 2 is a configuration diagram of a semiconductor memory apparatus in accordance with another embodiment of the present invention.

FIG. 2 is a configuration diagram of a semiconductor memory apparatus 2 in accordance with an embodiment of the present invention.

The semiconductor memory apparatus 2 as shown in FIG. 2 includes a configuration drawn in such a way for clearer technical description of an embodiment of the present invention.

Referring to FIG. 2, a semiconductor memory apparatus 2 includes a boosting voltage generation unit 100, a select signal driving unit 200, a control voltage transfer unit 300, and a voltage boosting control unit 400.

The boosting voltage generation unit 100 is configured to perform charge pumping and generate word line control voltages VPGM, VPASS and a boosting voltage VPP. The word line control voltages VPGM, VPASS include a word line programming voltage VPGM and a word line pass voltage VPASS.

The select signal driving unit 200 is configured to drive a select signal SEL to a select signal transmission line BLCWL using the boosting voltage VPP.

The control voltage transfer unit 300 is configured to transfer the word line control voltages VPGM, VPASS transmitted through a plurality of global word lines GWL<0> through GWL<N> to a plurality of local word lines WL<0> through WL<N> in response to the select signal SEL transmitted through the select signal transmission line BLCWL. In an embodiment of the present invention, the control voltage transfer unit 300 includes a plurality of NMOS transistors MN_0 through MN_N which are respectively connected between the plurality of global word lines GWL<0> through GWL<N> and the plurality of local word lines WL<0> through WL<N> and are controlled by the select signal SEL. Although FIG. 2 shows one select signal SEL controlling all NMOS transistors MN_0 through MN_N in accordance with an embodiment of the present invention, a different configuration is also possible in which a plurality of select signals (as opposed to a single SEL) may be utilized to control the plurality of NMOS transistors MN_0 through MN_N on either one-to-one or one-to-plural basis.

Coupling capacitance may be present between the select signal transmission line BLCWL and the plurality of global word lines GWL<0> through GWL<N>, and when the voltage levels of the plurality of global word lines GWL<0> through GWL<N> increase, the voltage level of the select signal transmission line BLCWL may be boosted due to the coupling capacitance.

The voltage boosting control unit 400 is configured to float the select signal transmission line BLCWL when the voltage level of the select signal transmission line BLCWL increases to or above a target level. That is, if the voltage level of the select signal transmission line BLCWL is boosted to be identical to or greater than the boosting voltage VPP, the voltage boosting control unit 400 electrically floats the select signal transmission line BLCWL. Since the select signal transmission line BLCWL is electrically floated, it continuously maintains the boosted voltage level. Therefore, because the select signal transmission line BLCWL maintains the boosted voltage level higher than the boosting voltage VPP, voltage transfer efficiency of the plurality of NMOS transistors MN_0 through MN_N is improved.

The voltage level of the select signal transmission line BLCWL precharged to the voltage of the boosting voltage terminal VPP is boosted by the word line control voltages VPGM, VPASS transmitted through the plurality of global word lines GWL<0> through GWL<N> so as to maintain the level higher than the boosting voltage VPP. In other words, the select signal SEL is initially driven by the voltage of the boosting voltage terminal VPP and is finally raised to the level higher than the voltage of the boosting voltage terminal VPP through a boosting operation.

Figure 3:
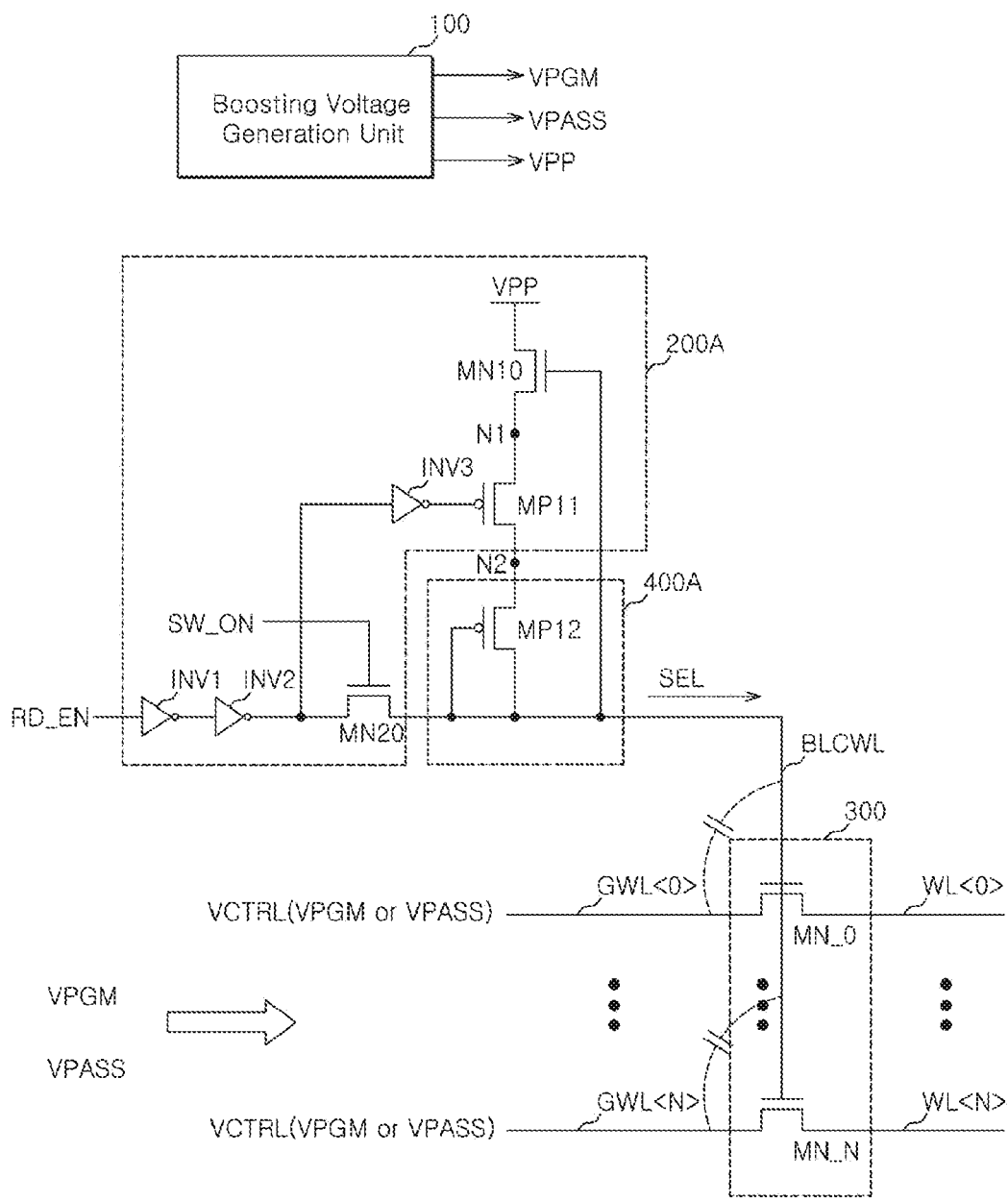
FIG. 3 is a diagram illustrating a first embodiment of the semiconductor memory apparatus shown in FIG. 2.

FIG. 3 is shows a semiconductor memory apparatus 2A in accordance with an embodiment of the present invention.

Referring to FIG. 3, a semiconductor memory apparatus 2A includes a boosting voltage generation unit 100, a select signal driving unit 200A, a control voltage transfer unit 300, and a voltage boosting control unit 400A.

The boosting voltage generation unit 100 is configured to perform charge pumping and generate word line control voltages VPGM, VPASS and a boosting voltage VPP. The word line control voltages VPGM, VPASS include a word line programming voltage VPGM and a word line pass voltage VPASS.

The select signal driving unit 200A includes a plurality of transistors MN10 and MP11 which drive a select signal SEL using the boosting voltage VPP of a boosting voltage terminal VPP under the control of a driving enable signal RD_EN. For the transistors MN10 and MN11, a first transistor MN10 has a drain terminal connected to the boosting voltage terminal VPP, a source terminal connected to a first node N1, and a gate terminal connected to a select signal transmission line BLCWL. A second transistor MN11 has source and drain terminals, which are connected between the first node N1 and a second node N2, and a gate terminal configured to receive the driving enable signal RD_EN. When the select signal driving unit 200A applies enough VPP to the select signal transmission line BLCWL, a switch MN20 is turned off before the select signal transmission line BLCWL is boosted. Since the switch is turned off, the select signal transmission line BLCWL is floated.

The voltage boosting control unit 400A includes a floating transistor MP12 which electrically floats the select signal transmission line BLCWL when the voltage level of the select signal transmission line BLCWL increases to or above a target level. The floating transistor MP12 has source and drain terminals, which are connected between the second node N2 and the select signal transmission line BLCWL, and a gate terminal connected to the select signal transmission line BLCWL. Namely, the floating transistor MP12 is connected in a diode type.

When the driving enable signal RD_EN is activated to a high level, the voltage level of the select signal transmission line BLCWL is raised through the voltage of the boosting voltage terminal VPP, that is, the boosting voltage VPP. Due to the coupling capacitance between the select signal transmission line BLCWL and a plurality of global word lines GWL<0> through GWL<N>, the voltage level of the select signal transmission line BLCWL is boosted when the voltage levels of the plurality of global word lines GWL<0> through GWL<N> increase.

The select signal transmission line BLCWL is electrically floated by the floating transistor MP12 when the voltage level of the select signal transmission line BLCWL reaches the boosting voltage VPP. That is, if the voltage level of the select signal transmission line BLCWL is boosted to be identical to or greater than the boosting voltage VPP, the select signal transmission line BLCWL is electrically floated by the floating transistor MP12. Because the select signal transmission line BLCWL is electrically floated, it continuously maintains the boosted voltage level. Therefore, because the select signal transmission line BLCWL maintains the boosted voltage level higher than the boosting voltage VPP, voltage transfer efficiency of the plurality of NMOS transistors MN_0 through MN_N of the control voltage transfer unit 300 is improved.

Figure 4:
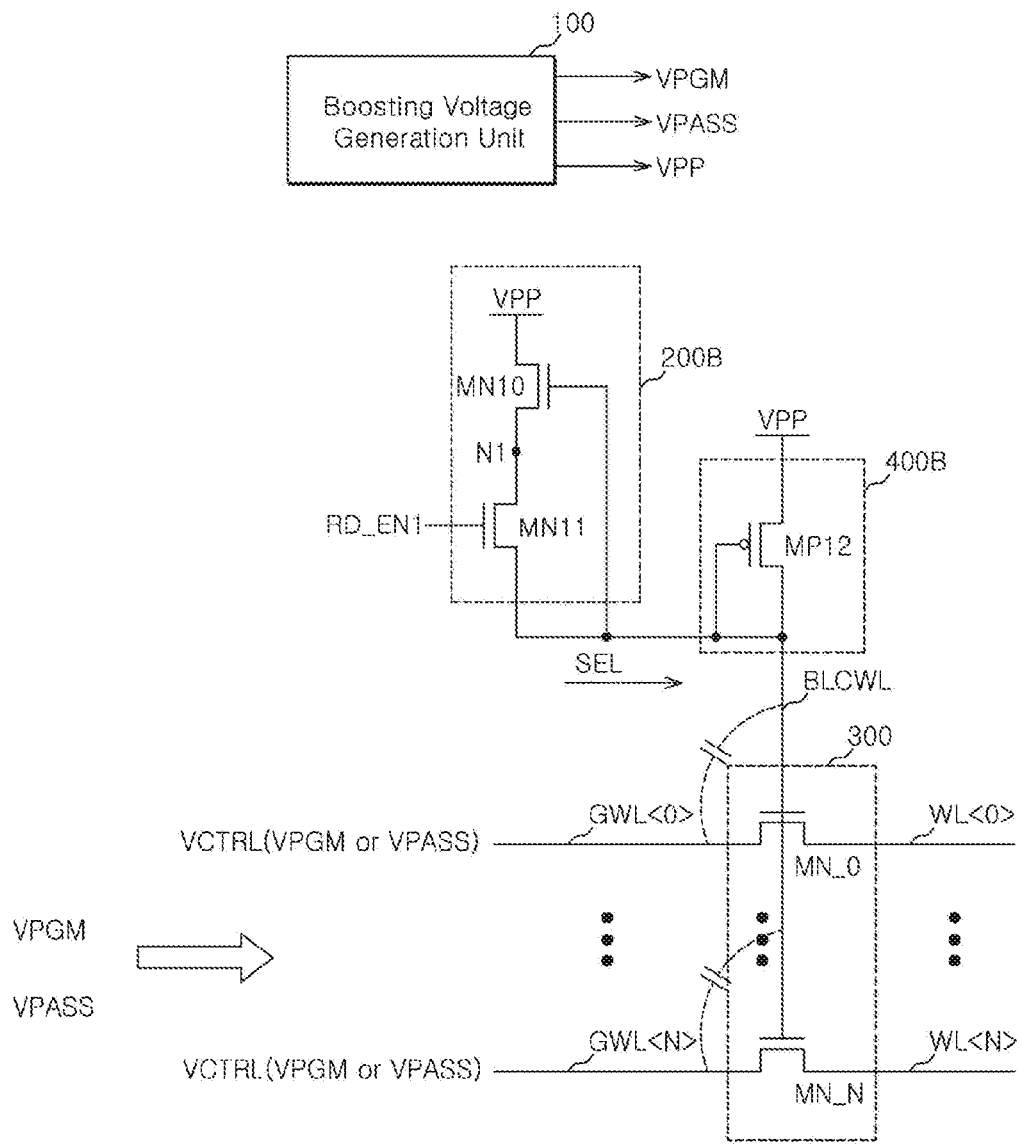
FIG. 4 is a diagram illustrating a second embodiment of the semiconductor memory apparatus shown in FIG. 2.

FIG. 4 shows the semiconductor memory apparatus 2B according to an embodiment of the present invention.

Referring to FIG. 4, a semiconductor memory apparatus 2B includes a boosting voltage generation unit 100, a select signal driving unit 200B, a control voltage transfer unit 300, and a voltage boosting control unit 400B.

The boosting voltage generation unit 100 is configured to perform charge pumping and generate word line control voltages VPGM, VPASS and a boosting voltage VPP. The word line control voltages VPGM, VPASS include a word line programming voltage VPGM and a word line pass voltage VPASS.

The select signal driving unit 200B includes a plurality of transistors MN10 and MN11 which drive a select signal SEL using the boosting voltage VPP of a boosting voltage terminal VPP under the control of a driving enable signal RD_EN1. In the plurality of transistors MN10 and MN11, a first transistor MN10 has a drain terminal connected to the boosting voltage terminal VPP, a source terminal connected to a first node N1, and a gate terminal connected to a select signal transmission line BLCWL. A second transistor MN11 has drain and source terminals connected between the first node N1 and the select signal transmission line BLCWL and a gate terminal receiving the driving enable signal RD_EN1. The driving enable signal RD_EN1 in an embodiment of the present invention as shown in FIG. 4 is defined as a signal that pulses to the boosting voltage VPP during a predetermined period. In other words, while in the driving enable signal RD_EN1 maintains the boosting voltage VPP, the voltage level of the select signal transmission line BLCWL is repeatedly raised by the threshold voltage of the first transistor MN10 and reaches approximately the boosting voltage VPP. Thereafter, when the select signal transmission line BLCWL is boosted and is raised in the voltage level thereof, the driving enable signal RD_EN1 is lowered to the level of a ground voltage VSS.

The voltage boosting control unit 400B includes a floating transistor MP12 which electrically floats the select signal transmission line BLCWL when the voltage level of the select signal transmission line BLCWL increases to or above a target level. The floating transistor MP12 has source and drain terminals connected between the boosting voltage terminal VPP and the select signal transmission line BLCWL and a gate terminal connected to the select signal transmission line BLCWL. The floating transistor MP12 according to an embodiment as shown in FIG. 4 is connected in a diode type.

If the driving enable signal RD_EN1 is activated to a high level, the voltage level of the select signal transmission line BLCWL is raised through the voltage of the boosting voltage terminal VPP, that is, the boosting voltage VPP. Due to the coupling capacitance between the select signal transmission line BLCWL and a plurality of global word lines GWL<0> through GWL<N>, when the voltage levels of the plurality of global word lines GWL<0> through GWL<N> increase, the voltage level of the select signal transmission line BLCWL is boosted.

The select signal transmission line BLCWL is electrically floated by the floating transistor MP12 when the voltage level of the select signal transmission line BLCWL reaches the boosting voltage VPP. That is, if the voltage level of the select signal transmission line BLCWL is boosted to be identical to or greater than the boosting voltage VPP, the select signal transmission line BLCWL is electrically floated by the floating transistor MP12. Because the select signal transmission line BLCWL is electrically floated, it continuously maintains the boosted voltage level. Therefore, because the select signal transmission line BLCWL maintains the boosted voltage level higher than the boosting voltage VPP, the voltage transfer efficiency of the plurality of NMOS transistors MN_0 through MN_N of the control voltage transfer unit 300 is improved.

Figure 5:
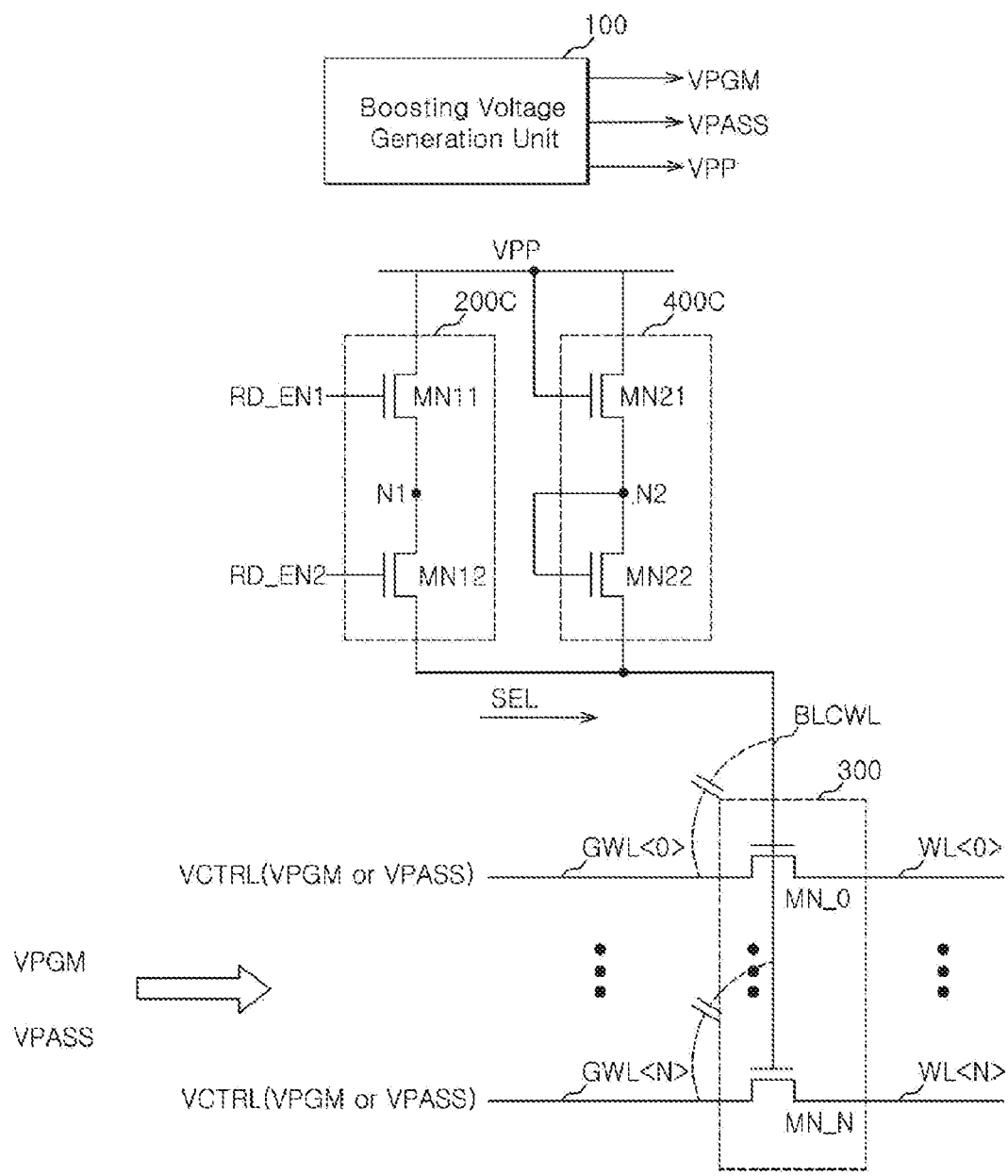
FIG. 5 is a diagram illustrating a third embodiment of the semiconductor memory apparatus shown in FIG. 2.

FIG. 5 shows a semiconductor memory apparatus 2C according to an embodiment of the present invention.

Referring to FIG. 5, a semiconductor memory apparatus 2C includes a boosting voltage generation unit 100, a select signal driving unit 200C, a control voltage transfer unit 300, and a voltage boosting control unit 400C.

The boosting voltage generation unit 100 is configured to perform charge pumping and generate word line control voltages VPGM, VPASS and a boosting voltage VPP. The word line control voltages VPGM, VPASS include a word line programming voltage VPGM and a word line pass voltage VPASS.

The select signal driving unit 200C includes a plurality of transistors MN11 and MN12 which drive a select signal SEL using the boosting voltage VPP of a boosting voltage terminal VPP under the control of driving enable signals RD_EN1 and RD_EN2. In the plurality of transistors MN11 and MN12, a first transistor MN11 has drain and source terminals connected between the boosting voltage terminal VPP and a first node N1 and a gate terminal receiving a first driving enable signal RD_EN1. A second transistor MN12 has drain and source terminals connected between the first node N1 and a select signal transmission line BLCWL and a gate terminal receiving a second driving enable signal RD_EN2. The first and second driving enable signals RD_EN1 and RD_EN2 according to an embodiment as shown in FIG. 5 are defined as signals which pulse to the boosting voltage VPP during a predetermined period. In other words, while the first and second driving enable signals RD_EN1 and RD_EN2 maintain the boosting voltage VPP, the voltage level of the select signal transmission line BLCWL is raised until it reaches approximately the boosting voltage VPP. Thereafter, when the select signal transmission line BLCWL is boosted and is raised in the voltage level thereof, the first and second driving enable signals RD_EN1 and RD_EN2 are lowered to the level of a ground voltage VSS.

The voltage boosting control unit 400C includes a plurality of floating transistors comprising a first and second floating transistors MN21 and MN22 which electrically float the select signal transmission line BLCWL when the voltage level of the select signal transmission line BLCWL increases to or above a target level. The first floating transistor MN21 has drain and source terminals connected between the boosting voltage terminal VPP and a second node N2 and a gate terminal connected to the boosting voltage terminal VPP. A second floating transistor MN22 has drain and source terminals connected between the second node N2 and the select signal transmission line BLCWL and a gate terminal connected to the second node N2. The first and second floating transistors MN21 and MN22 are connected in a diode type according to an embodiment as shown in FIG. 5.

If the first and second driving enable signals RD_EN1 and RD_EN2 are activated to a high level (the boosting voltage), the voltage level of the select signal transmission line BLCWL is raised through the voltage of the boosting voltage terminal VPP, that is, the boosting voltage VPP. Due to the coupling capacitance between the select signal transmission line BLCWL and a plurality of global word lines GWL<0> through GWL<N>, when the voltage levels of the plurality of global word lines GWL<0> through GWL<N> increase, the voltage level of the select signal transmission line BLCWL is boosted.

The select signal transmission line BLCWL is electrically floated by the plurality of floating transistors comprising MN21 and MN22 when the voltage level of the select signal transmission line BLCWL reaches the boosting voltage VPP. That is, when the voltage level of the select signal transmission line BLCWL is boosted to be identical to or greater than the boosting voltage VPP, the select signal transmission line BLCWL is electrically floated by the plurality of floating transistors comprising MN21 and MN22. Because the select signal transmission line BLCWL is electrically floated, it continuously maintains the boosted voltage level. Therefore, because the select signal transmission line BLCWL maintains the boosted voltage level higher than the boosting voltage VPP, the voltage transfer efficiency of the plurality of NMOS transistors MN_0 through MN_N of the control voltage transfer unit 300 is improved.

FIG. 6 is a timing diagram for illustrating the internal operations of the semiconductor memory apparatus according to various embodiments as shown in FIGS. 2 through 5.

First, if the driving enable signal RD_EN is activated to the high level, the voltage level of the select signal transmission line BLCWL is raised since the select signal driving unit drives the select signal SEL.

Next, when the word line control voltages VPGM, VPASS are transferred through the plurality of global word lines GWL<0> through GWL<N>, the voltage level of the select signal transmission line BLCWL is boosted by the coupling capacitance. Because the select signal transmission line BLCWL is electrically floated by the voltage boosting control unit, the boosted voltage level is continuously maintained.

Because the select signal transmission line BLCWL is connected to the gate terminals of the plurality of NMOS transistors MN_0 through MN_N of the control voltage transfer unit 300, the voltage transfer efficiency of the plurality of NMOS transistors MN_0 through MN_N, which are controlled by the boosted voltage level, is improved. The voltage transfer efficiency when the word line control voltages VPGM, VPASS transmitted through the plurality of global word lines GWL<0> through GWL<N> are transferred to the plurality of local word lines WL<0> through WL<N> through the plurality of NMOS transistors MN_0 through MN_N is improved.

Although the technology for transferring voltages between global word lines (such as GWL<0> through GWL<N>) and local word lines (such as WL<0> through WL<N>) has been described in this disclosure according to various embodiments of the present invention, it is noted that the technical principles as disclosed herein are also applicable to the transfer of control voltages between a plurality of transmission lines in a general semiconductor apparatus.

As can be readily seen from the above description, a control voltage transfer method for transferring control voltages transmitted through first transmission lines to second transmission lines in response to a select signal transmitted through a select signal transmission line includes the steps of floating the select signal transmission line when a voltage level of the select signal transmission line increases to or above a target level, and boosting the voltage level of the select signal transmission line as voltage levels of the control voltages transmitted through the first transmission lines increase. The select signal transmission line may be precharged to a predetermined voltage level before being boosted.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors are changeable as the occasion demands in order to realize the same function. For example, the configurations of a PMOS transistor and an NMOS transistor are changeable to different combinations of PMOS and/or NMOS and/or other various transistors, and these changes can be readily inferred by those skilled in the pertinent art.

While certain embodiments have been described above, it will be understood to those skilled in the art that the embodiments described are by way of example only. Accordingly, the semiconductor apparatus and the method for transferring a control voltage described herein should not be limited based on the described embodiments. Rather, the semiconductor apparatus and the method for transferring a control voltage described herein should only be limited in light of the claims that follow when taken in conjunction with the above description and accompanying drawings.

What is claimed is:

1. A semiconductor apparatus comprising:
   a control voltage transfer unit configured to transfer a control voltage transmitted through first transmission lines to second transmission lines in response to a select signal transmitted through a select signal transmission line;
   a select signal driving unit configured to drive the select signal to the select signal transmission line; and
   a voltage boosting control unit configured to float the select signal transmission line when a voltage level of the select signal transmission line increase to or above a target level.

2. The semiconductor apparatus according to claim 1, further comprising:
   a boosting voltage generation unit configured to generate a boosting voltage by performing charge pumping,
   wherein the select signal driving unit drives the select signal by using the boosting voltage as a driving voltage.

3. The semiconductor apparatus according to claim 1, wherein the control voltage transfer unit comprises voltage transfer transistors which are electrically connected between the first transmission lines and the second transmission lines and are controlled by the select signal.

4. The semiconductor apparatus according to claim 1, wherein the select signal driving unit comprises at least one transistor which drives the select signal using a voltage of a driving voltage terminal under the control of a driving enable signal.

5. The semiconductor apparatus according to claim 1, wherein the voltage boosting control unit comprises at least one transistor which electrically floats the select signal transmission line when the voltage level of the select signal transmission line increases to or above the target level.

6. The semiconductor apparatus according to claim 1, wherein the first transmission lines comprise global word lines, and the second transmission lines comprise local word lines.

7. The semiconductor apparatus according to claim 1, wherein the control voltage comprises a word line programming voltage or a word line pass voltage.

8. A control voltage transfer method for transferring a control voltage transmitted through first transmission lines to second transmission lines in response to a select signal transmitted through a select signal transmission line, comprising the steps of:

floating the select signal transmission line when a voltage level of the select signal transmission line increases to or above a target level; and boosting the voltage level of the select signal transmission line as a voltage level of the control voltage transmitted through the first transmission lines increases.

9. The method according to claim 8, wherein the first transmission lines comprise global word lines, and the second transmission lines comprise local word lines.

10. The method according to claim 8, wherein the control voltage comprises a word line programming voltage or a word line pass voltage.

11. The method according to claim 8, further comprising the step of:

precharging the select signal transmission line to a predetermined voltage level.

12. The method according to claim 8, further comprising the step of:

driving the select signal using a boosting voltage which is generated through charge pumping.

* * * * *